(12) United States Patent
Fujimoto

(10) Patent No.: US 6,655,210 B2
(45) Date of Patent: Dec. 2, 2003

(54) COMPOSITE VIBRATOR, VIBRATION GYROSCOPE USING COMPOSITE VIBRATOR, ELECTRONIC APPARATUS USING VIBRATION GYROSCOPE, AND METHOD OF MANUFACTURING COMPOSITE VIBRATOR

(75) Inventor: Katsumi Fujimoto, Kaminiikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 85 days.

(21) Appl. No.: 10/008,759

(22) Filed: Nov. 8, 2001

(65) Prior Publication Data

US 2002/0100324 A1 Aug. 1, 2002

(30) Foreign Application Priority Data

Nov. 10, 2000 (JP) ........................................ 2000-343332

(51) Int. Cl.[7] ............................................... G01C 19/00
(52) U.S. Cl. ................. 73/504.14; 310/368; 310/313 R
(58) Field of Search .......................... 73/504.14, 504.12, 73/504.04, 504.03, 504.02; 310/313 R, 313 A, 367, 368, 336

(56) References Cited

FOREIGN PATENT DOCUMENTS

JP          07-332988         12/1995

*Primary Examiner*—Richard A. Moller
(74) *Attorney, Agent, or Firm*—Keating & Bennett, LLP

(57) ABSTRACT

The present invention provides a composite vibrator that can maintain high sensitivity even when miniaturized. The composite vibrator includes tuning bar vibrators having the same length and support members for supporting the tuning bar vibrators. The tuning bar vibrators are arranged in a direction orthogonal to the longitudinal direction to be coupled with each other near nodes of bending vibrations occurring at both free ends of the tuning bar vibrators. In this arrangement, since the tuning bar vibrators are coupled with each other, the mass of the composite vibrator increases. Thus, even when the length of the longitudinal direction of the tuning bar vibrator is reduced, due to the increased mass, higher sensitivity for the detection of an angular velocity can be obtained.

8 Claims, 16 Drawing Sheets

A MODE

B MODE

A MODE

B MODE

COMPOSITE VIBRATOR, VIBRATION GYROSCOPE USING COMPOSITE VIBRATOR, ELECTRONIC APPARATUS USING VIBRATION GYROSCOPE, AND METHOD OF MANUFACTURING COMPOSITE VIBRATOR

BACKGROUND OF THE INVENTION

1. Field of the Invention

The present invention relates to composite vibrators, vibration gyros using the vibrators, and electronic apparatuses incorporating the gyroscopes. In addition, the invention relates to methods of manufacturing the composite vibrators. More particularly, the invention relates to composite vibrators incorporated in video cameras with a shake preventing function, car navigation systems, pointing devices, or the like, vibration gyroscopes using the vibrators, electronic apparatuses incorporating the vibration gyroscopes, and methods of manufacturing the composite vibrators.

2. Description of the Related Art

FIG. 22 shows a perspective view of a conventional vibration gyroscope. In this figure, a vibration gyroscope 60 includes a tuning bar vibrator 600 and a frame 610. The turning bar vibrator 600 includes a first piezoelectric member 101 polarized in its thickness direction, with a first electrode 104a and a second electrode 104b having the same dimensions being formed on a main surface thereof, a second piezoelectric member 102 polarized in its thickness direction, with a third electrode 105 formed on a main surface thereof, and conductive support members 106a, 106b, 106c, and 106d. The first electrode 104a and the second electrode 104b are arranged in the longitudinal direction of the tuning bar vibrator 600 at a predetermined distance in the width direction. The other main surface of the first piezoelectric member 101 is bonded to the other main surface of the second piezoelectric member 102 via an intermediate electrode 103. In each of the first and second piezoelectric members 101 and 102, a ratio between the length L1 of the thickness direction and the length L2 of the width direction, that is, the value of L1/L2 is set to be approximately 1. In the tuning bar vibrator 600, in positions (near nodes N1 and N2) in which the nodes N1 and N2 (axes) of bending vibrations at both free ends in the thickness direction are projected perpendicularly to a main surface of the tuning bar vibrator 600, the support member 106a is connected to the first electrode 104a, the support member 106b is connected to the second electrode 104b, and the support members 106c and 106d are connected to the third electrode 105. The frame 610 is made of resin and has a sufficiently large mass. The end portions of the support members 106a, 106b, 106c, and 106d are fixed to the frame 610.

The vibration gyroscope 60 having the above structure performs bending vibrations at both free ends when an excitation signal is applied to the third electrode 105 via the support members 106c and 106d. The nodes obtained in the vibrations are N1 and N2 as axes orienting in the width direction of the vibration gyroscope 60. When there is applied an angular velocity whose rotational axis is the longitudinal direction of the tuning bar vibrator 600, the vibration gyroscope 60 performs bending vibrations at both free ends in the width direction orthogonal to the direction of excitation. The vibration nodes obtained in this case are N3 and N4 as axes orienting in the thickness direction substantially at the center in the width direction of the vibration gyroscope 60. Signals of bending in the width direction are output from the first electrode 104a and the second electrode 104b.

In the vibration gyroscope 60, when the tuning bar vibrator 600 vibrates in the thickness direction and the width direction, the center of gravity shifts. Then, the vibrations of the tuning bar vibrator 600 partially leak to the outside frame 610 via the support members 106a, 106b, 106c, and 106d. The frame 610 absorbs the vibrations leaking from the tuning bar vibrator 600.

Conventional vibration gyroscopes are described in Japanese Unexamined Patent Application Publication No. 7-332988, and the like.

In general, a vibrator gyroscope requires miniaturization. Particularly, the length of the longitudinal direction of a tuning bar vibrator needs to be reduced, since the length is longer than the lengths of the widthwise and thickness directions thereof. However, the sensitivity of a vibration gyroscope is proportional to a given angular velocity, a vibration velocity of a vibrator, and the mass of the vibrator. Thus, when the length of the longitudinal direction of the tuning bar vibrator is reduced, the mass of the composite vibrator decreases and thereby the sensitivity of the vibration gyroscope is deteriorated.

In addition, when the vibrations of the tuning bar vibrator leaks outside, the amplitude of the vibrator is attenuated. As a result, the sensitivity of the vibration gyroscope is deteriorated.

In addition, due to the deteriorated sensitivity of the vibration gyroscope, the ratio of noise with respect to signal increases. Furthermore, since the temperature characteristics of support members and an acceleration detecting circuit become more influential, a value detected for an angular velocity tends to change.

SUMMARY OF THE INVENTION

Accordingly, it is an object of the present invention to provide a composite vibrator which can maintain high sensitivity even when miniaturized.

In addition, it is another object of the invention to provide a method of easily manufacturing the composite vibrator.

In addition, it is another object of the invention to provide a vibration gyroscope using the composite vibrator, which can maintain high sensitivity even when miniaturized.

In addition, it is another object of the invention to provide an electronic apparatus using the vibration gyroscope capable of accurately detecting an angular velocity to precisely control the angular velocity.

To this end, according to the present invention, there is provided a composite vibrator including a plurality of tuning bar vibrators having the same length and support members for supporting the tuning bar vibrators. In this composite vibrator, the tuning bar vibrators with both ends free are arranged in a direction orthogonal to a longitudinal direction of the tuning bar vibrators and are coupled with each other in the vicinity of nodes of bending vibrations.

In addition, the plurality of tuning bar vibrators may include at least two tuning bar vibrators having the same configuration.

In addition, each tuning bar vibrator may include an electrode to which a signal for exciting the tuning bar vibrator is applied and an electrode from which a signal corresponding to bending vibration of the tuning bar vibrator in a direction orthogonal to the direction of excitation is output.

In addition, adjacent tuning bar vibrators may be excited in mutually opposite directions.

In addition, a resonant frequency in the exciting direction of at least one of the tuning bar vibrators may coincide with a resonant frequency in the direction orthogonal to the exciting direction.

In addition, at least two electrodes formed in the longitudinal direction of a main surface of each tuning bar vibrator may be arranged at a predetermined distance in the width direction thereof.

According to the present invention, there is provided a vibration gyroscope including a driving unit for driving the composite vibrator and a detecting unit for detecting an angular velocity via the composite vibrator.

Further there is provided an electronic apparatus including the above vibration gyroscope.

There is provided a method of manufacturing a composite vibrator. The method includes a first step of bonding an auxiliary substrate to a second main surface of a base substrate, a second step of completely cutting the base substrate from the direction of a first main-surface side of the base substrate while leaving a part of the auxiliary substrate to form a plurality of tuning bar vibrators arranged in a width direction, the relative positions of the tuning bar vibrators being retained by the auxiliary substrate, a third step of bonding support members to the first main surfaces of the tuning bar vibrators, and a fourth step of separating the auxiliary substrate from the second main surfaces of the tuning bar vibrators.

In addition, the base substrate may have electrodes formed on both main surfaces thereof.

In addition, the base substrate may be formed by bonding two piezoelectric substrates polarized in mutually opposite directions with respect to the thickness direction thereof.

Alternatively, the base substrate may be formed by bonding a conductive substrate to a piezoelectric substrate polarized in the thickness direction.

In addition, the second step may include forming grooves along one of the longitudinal and width directions on the first main surfaces of the tuning bar vibrators.

In addition, the third step may include bonding the support members in the vicinity of nodes of bending vibrations of the tuning bar vibrators with both ends free.

In addition, the composite vibrator manufacturing method may further include a fifth step of bonding support members to the nodes on the second main surfaces of the tuning bar vibrators after the first to fourth steps are performed.

In the above arrangement of the composite vibrator of the invention, since the plurality of tuning bar vibrators is coupled with each other, the mass of the composite vibrator increases. Thus, even when the length of the longitudinal direction is reduced, due to the increased mass, its sensitivity for the detection of an angular velocity is improved.

Additionally, in the composite vibrator of the invention, since the tuning bar vibrators are excited in mutually opposite directions to be bent in mutually opposite directions, the vibrations of the tuning bar vibrators are trapped inside and thereby the vibrations hardly leak outside. As a result, since loss caused by the leaked vibrations of the tuning bar vibrators decreases, the angular-velocity detection sensitivity is improved.

In addition, since the vibration gyroscope of the invention uses the composite vibrator with high detection sensitivity, its angular-velocity detection sensitivity is improved.

In addition, since the vibration gyroscope of the invention uses the compact composite vibrator, miniaturization of the vibration gyroscope can be achieved.

Furthermore, in the method of manufacturing the composite vibrator according to the invention, in the first step, the base substrate is bonded to the auxiliary substrate, and while keeping the bonding state, the second and third steps are sequentially performed. Thus, without causing positional deviation of the tuning bar vibrators, the composite vibrator including the tuning bar vibrators having the same configuration can be easily manufactured.

Furthermore, the electronic apparatus of the invention uses the vibration gyroscope capable of accurately detecting an angular velocity with high sensitivity, a precise controlling mechanism can be formed.

DESCRIPTION OF THE PREFERRED EMBODIMENTS

Figure 1:
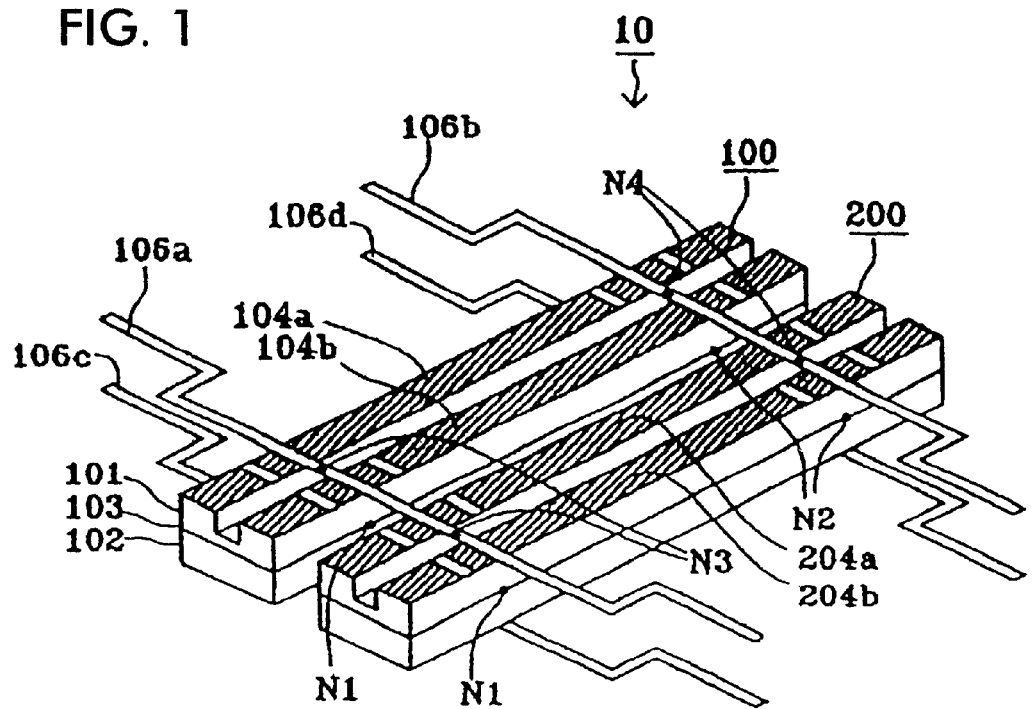
FIG. 1 is a perspective view of a composite vibrator according to an embodiment of the present invention.
Figure 4:
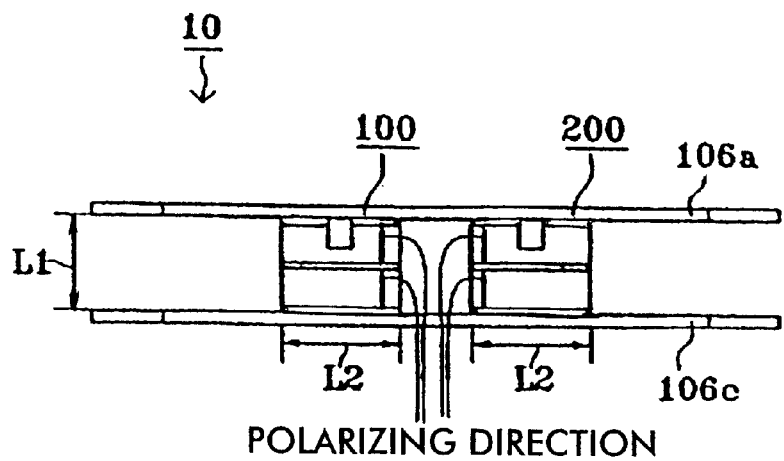
FIG. 4 is a left side view of the composite vibrator shown in FIG. 1.
Figure 2:
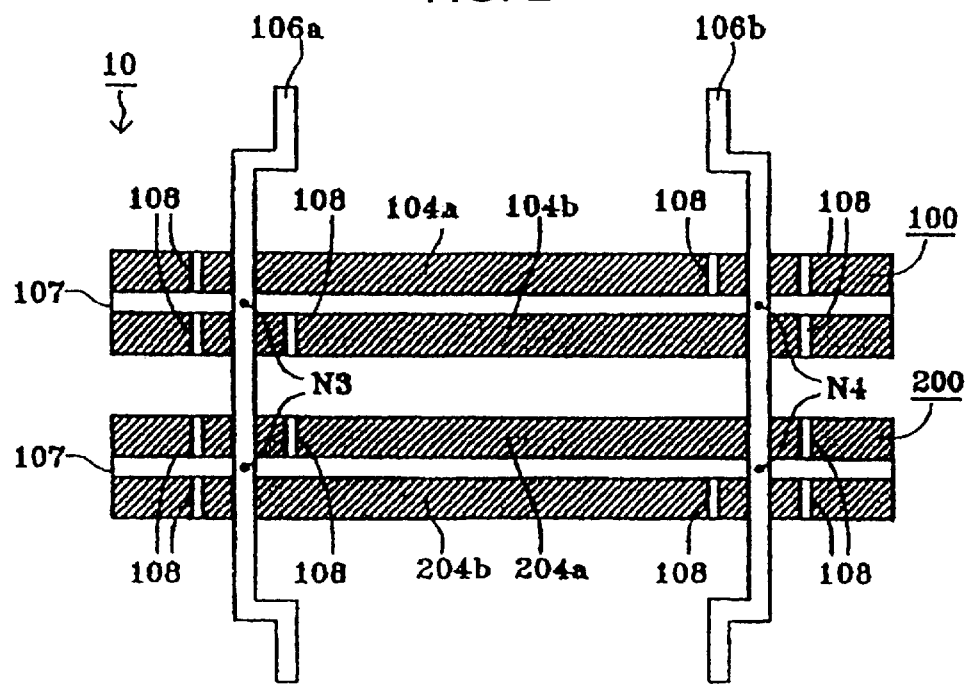
FIG. 2 is a plan view of the composite vibrator shown in FIG. 1.
Figure 3:
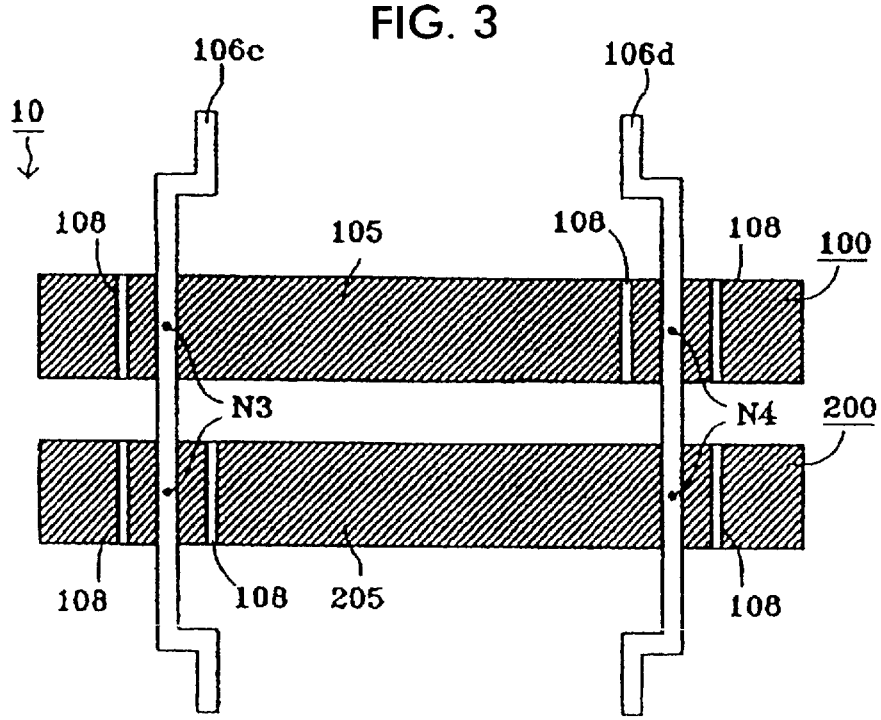
FIG. 3 is a bottom view of the composite vibrator shown in FIG. 1.
Figure 22:
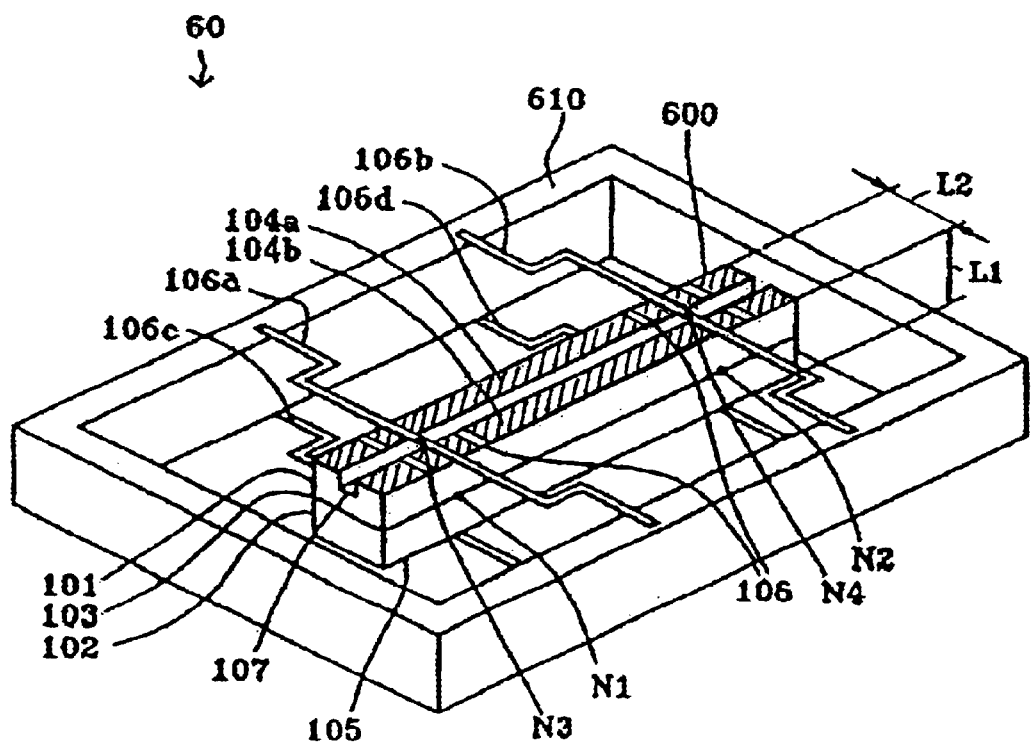
FIG. 22 is a perspective view of a conventional vibration gyroscope.

Each of FIGS. 1 to 4 shows a composite vibrator according to an embodiment of the present invention. FIG. 1 is a perspective view of the composite vibrator, FIG. 2 is a plan view thereof, FIG. 3 is a bottom view thereof, and FIG. 4 is a left side view thereof. In FIGS. 1 to 4, the reference numerals used in the vibration gyroscope 60 shown in FIG. 22 are given to the same and equivalent parts shown in the figures, and the explanation of the parts will be omitted.

In each of FIGS. 1 to 4, a composite vibrator 10 of the invention is a vibrator used in a vibration gyroscope and includes two tuning bar vibrators 100 and 200 having the same length and sectional dimensions and support members 106a, 106b, 106c, and 106d for supporting the tuning bar vibrators 100 and 200. The tuning bar vibrators 100 and 200 are made of the same material as that of the tuning bar vibrator 600 shown in FIG. 22 and are polarized in the same directions indicated by arrows shown in FIG. 4. A ratio between the length L1 of a thickness direction of each vibrator and the length L2 of a width direction thereof, that is, the value of L1/L2, is set to be approximately 0.8. This is the only part different from the structure of the tuning bar vibrator 600. The tuning bar vibrators 100 and 200 are arranged in a direction orthogonal to the longitudinal directions thereof. Then, near positions in which positions (axes) as nodes N1 and N2 of bending vibrations in the thickness direction at both free ends of the tuning bar vibrators are projected perpendicularly to main surfaces of the tuning bar vibrators 100 and 200, the tuning bar vibrators 100 and 200 are coupled with each other via the support members 106a, 106b, 106c, and 106d.

Here, first, a description will be given of a method of manufacturing the composite vibrator of the invention with reference to FIGS. 5A to 5C and FIGS. 6A to 6C. In this method, first to fifth steps will be performed as follows.

Figure 5A:
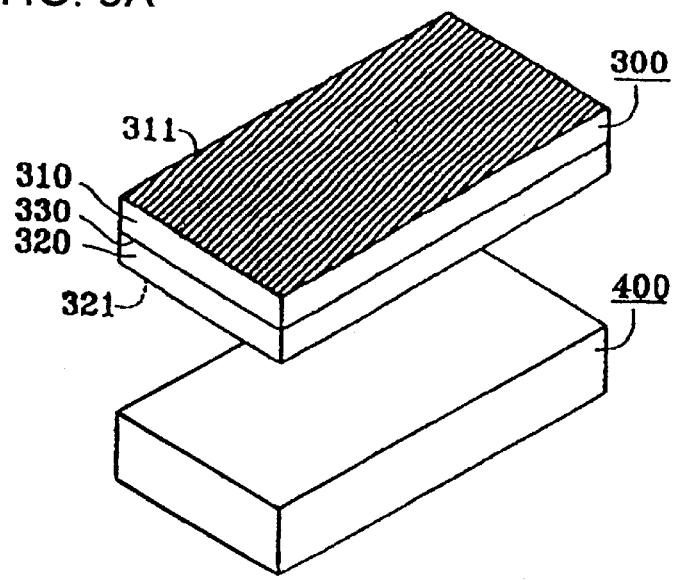
FIGS. 5A to 5C show perspective views illustrating the former procedures in a method of manufacturing the composite vibrator shown in FIG. 1.

As shown in FIG. 5A, first, there is provided a base substrate 300 formed by bonding a first piezoelectric substrate 310 polarized in a thickness direction and a second piezoelectric substrate 320 polarized in a thickness direction opposed to the first piezoelectric substrate 310 via an electrode 300. An electrode 311 is formed on a first main surface of the base substrate 300 and an electrode 321 is formed on a second main surface thereof.

Figure 5B:
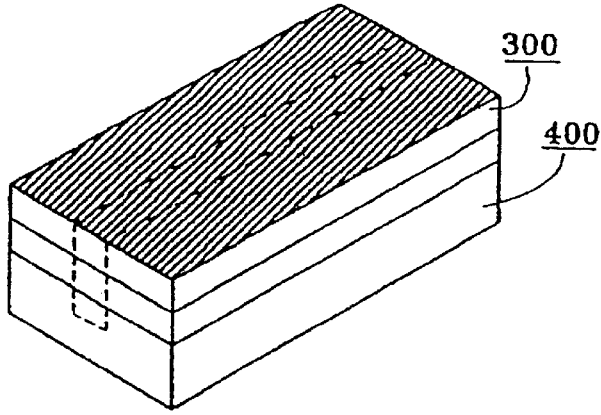

In the first step of the method of manufacturing the composite vibrator according to the present invention, as shown in FIG. 5B, an auxiliary substrate 400 made of resin is bonded to the second main surface of the base substrate 300 with an adhesive.

Figure 5C:
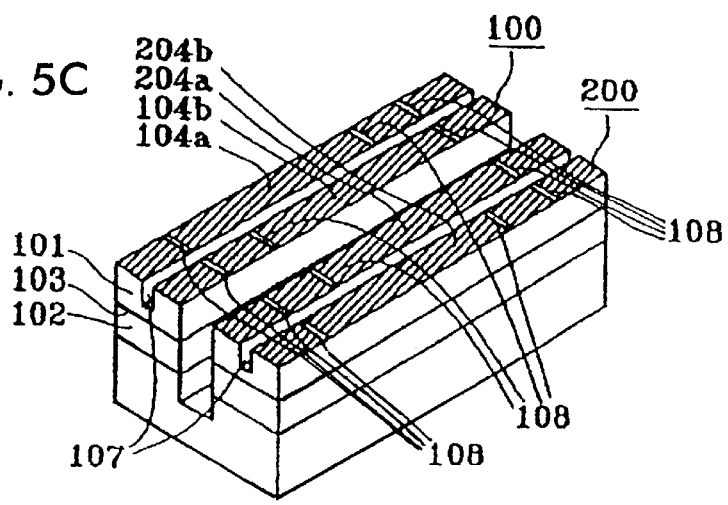

In the second step, as shown in FIG. 5C, the base substrate 300 is completely cut from the direction of the first main-surface side thereof by a dicer or the like to form tuning bar vibrators 100 and 200 arranged in a width direction, while leaving a part of the auxiliary substrate 400. This arrangement retains the positions of the tuning bar vibrators 100 and 200 adjacent to each other in the width direction via the auxiliary substrate 400. Furthermore, on first main surfaces of the tuning bar vibrators 100 and 200, deep grooves 107 are formed in the longitudinal directions of the tuning bar vibrators and shallow grooves 108 are formed in the width directions thereof to form first electrodes 104a and 204a and second electrodes 104b and 204b. The deep grooves 107 are formed by digging into parts of the first piezoelectric substrate 310 and the shallow grooves 108 are formed by cutting only the electrode 311. For example, the electrode 311 is cut by a laser or the like.

Figure 6A:
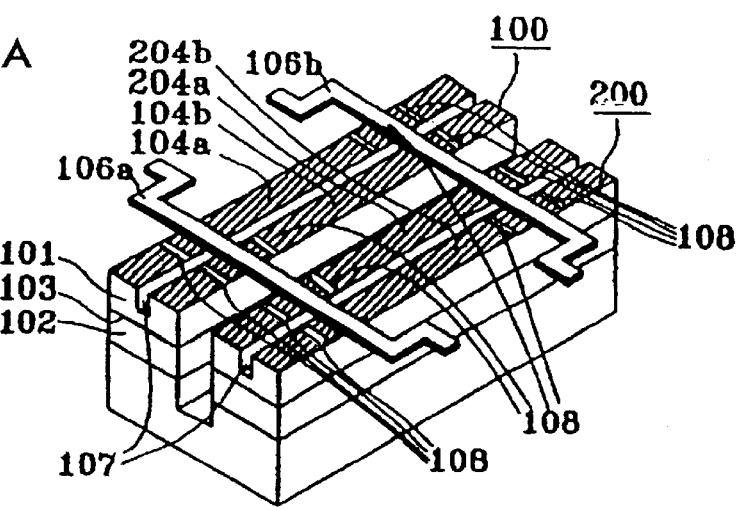
FIGS. 6A to 6C show perspective views illustrating the latter procedures in the method.

In the third step, as shown in FIG. 6A, support members 106a and 106b are bonded to the first main surfaces of the tuning bar vibrators 100 and 200.

Figure 6B:
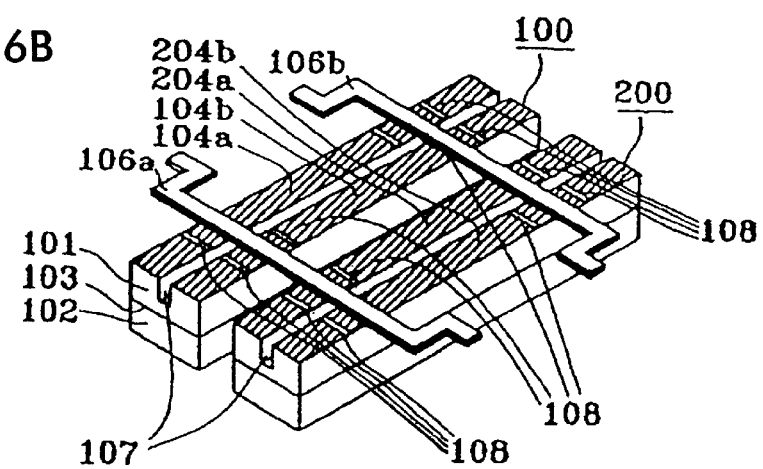

In the fourth step, the auxiliary substrate 400 and the tuning bar vibrators 100 and 200 are soaked into a parting agent. Then, as shown in FIG. 6B, the auxiliary substrate 400 is separated from the second main surfaces of the tuning bar vibrators 100 and 200. Sequentially, the shallow grooves 108 (not shown) are formed into the electrodes 311 of the tuning bar vibrators 100 and 200 in the width directions to form third electrodes 105 and 205 (not shown).

Figure 6C:
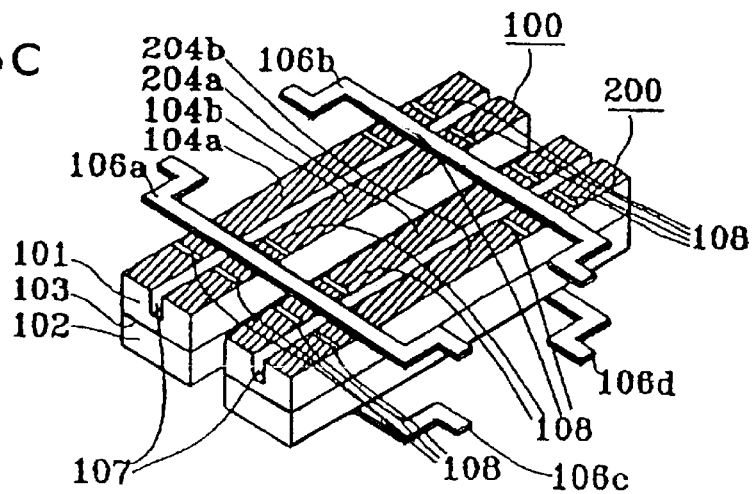

In the fifth step, as shown in FIG. 6C, support members 106c and 106d are bonded to the tuning bar vibrators 100 and 200.

In this method, as described above, in the first step, the base substrate 300 is bonded to the auxiliary substrate 400, and while maintaining the bonding state, the first and third steps are sequentially performed. Thus, the support members 106a and 106b can be disposed without causing deviations in the relative positions of the tuning bar vibrators 100 and 200 having the same configuration.

Furthermore, in the fifth step, in the state in which the support members 106a and 106b are bonded to the tuning bar vibrators 100 and 200, the support members 106c and 106d are bonded. Thus, without causing any positional deviation in the tuning bar vibrators 100 and 200, the composite vibrator 10 can be easily manufactured.

Figure 7:
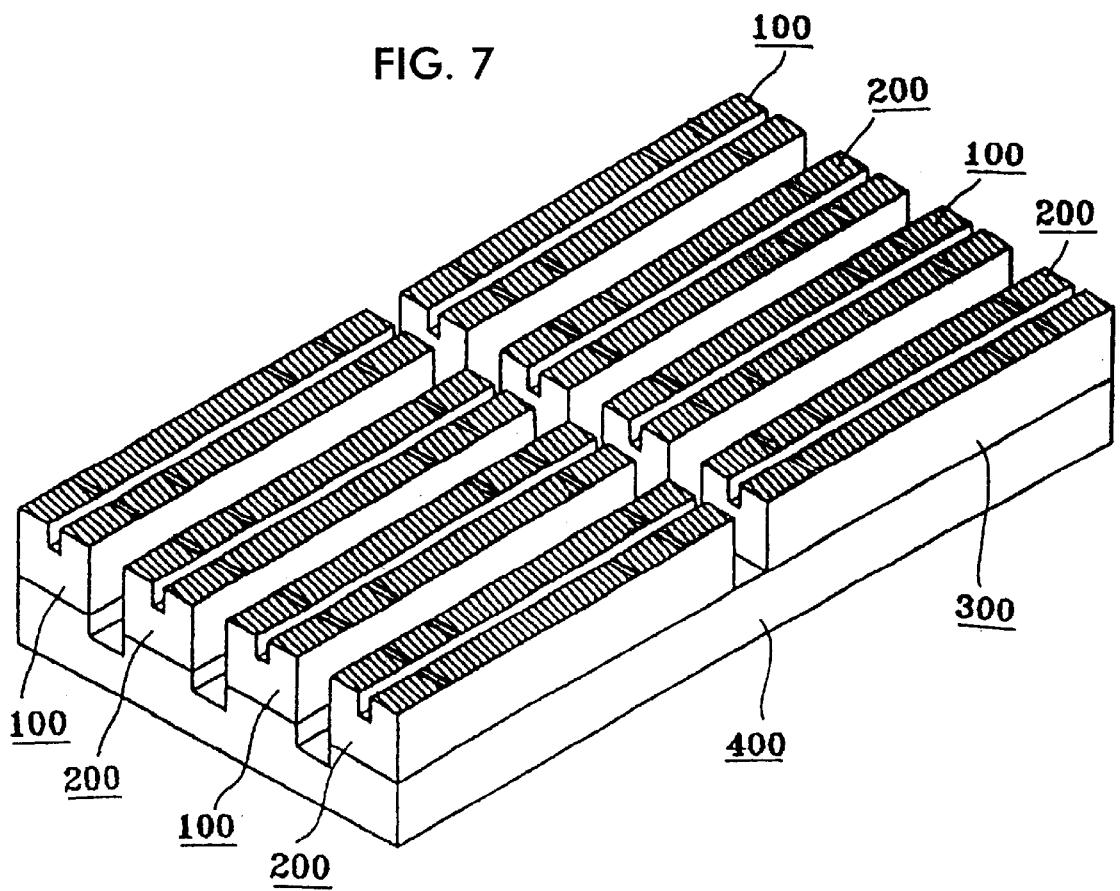
FIG. 7 is a perspective view illustrating more details about a second step of the above method.

As shown in FIG. 7, in the second step of the method, alternatively, in the state in which the base substrate 300 is partially bonded to the auxiliary substrate 400, the base substrate may be split into two or more tuning bar vibrators 100 and 200. In addition, the base substrate used in the method of manufacturing the composite vibrator of the invention may be a substrate formed by bonding piezoelectric substrates polarized in the width directions thereof or bonding a conductive substrate to a piezoelectric substrate.

Figure 8:
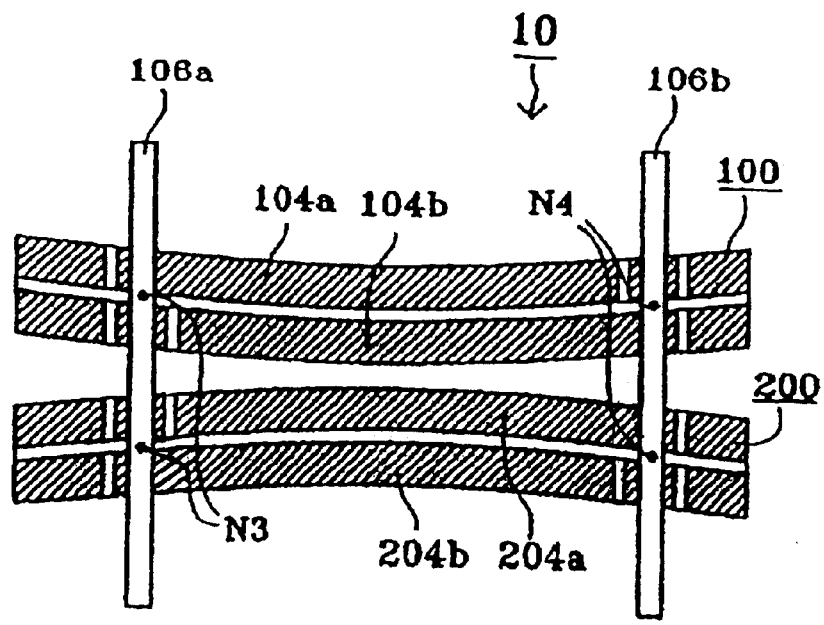
FIG. 8 is a plan view showing a state of vibrations of the composite vibrator shown in FIG. 1.

Next, referring to FIGS. 8 and 9, a description will be given of the performance of the composite vibrator 10 according to the invention. FIG. 8 shows a plan view of a state of the vibrations of the composite vibrator 10 and FIG. 9 shows a front view of a state of the vibrations thereof.

Figure 9:
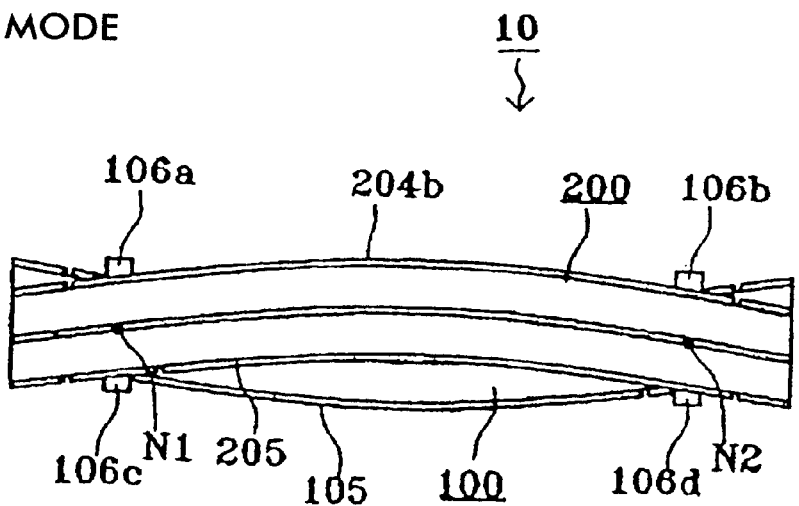
FIG. 9 is a front view showing a state of vibrations of the composite vibrator shown in FIG. 1.

In the composite vibrator 10 shown in each of FIGS. 8 and 9, an excitation signal is applied between the first and second electrodes 104a and 204b connected to the support member 106a and the first and second electrodes 204a and 104b connected to the support member 106b. Then, the tuning bar vibrators 100 and 200 are excited in mutually opposite directions and then perform free end bending vibrations in the width direction, in which nodes of the vibrations are N3 and N4, which are symmetrical to the width direction of the composite vibrator 10 and are axes orienting in the thickness directions substantially at the centers in the width directions of the tuning bar vibrators 100 and 200. Hereinafter, the mode of such bending vibrations in the width directions mode will be referred to as A mode.

When there is given an angular velocity whose rotational axis is the longitudinal direction of the composite vibrator 10, the tuning bar vibrators 100 and 200 perform bending vibrations in mutually opposite directions, that is, they perform bending vibrations at both free ends in the thickness direction, in which the vibrators 100 and 200 vibrate in mutually opposite directions in the thickness direction of the composite vibrator 10, and nodes of the vibrations are N1 and N2. Hereinafter, the mode of such bending vibrations in the thickness direction will be referred to as B mode. Signals corresponding to bending vibrations in the thickness direction are output from the third electrodes 105 and 205 via the support members 106c and 106d.

In the composite vibrator 10 having the above structure, since the two tuning bar vibrators 100 and 200 are coupled with each other, the mass of the composite vibrator 10 increases. Therefore, even when the length of the longitudinal direction is reduced, due to the increased mass, the sensitivity for the detection of an angular velocity is improved. Even if the lengths of the longitudinal directions of the tuning bar vibrators 100 and 200 are halved, basically, the detection sensitivity is not reduced.

In addition, in the composite vibrator 10 of the invention, unlike a case in which the tuning bar vibrators 100 and 200 are supported in positions other than the nodes thereof, the tuning bar vibrators 100 and 200 are supported at the nodes N1, N2, N3, and N4 or near these nodes. Thus, bending vibrations occurring at both free ends of the tuning bar vibrators 100 and 200 are not hindered and the angular-velocity detection sensitivity is hardly deteriorated.

In the composite vibrator 10, since the tuning bar vibrators 100 and 200 are excited in mutually opposite directions to be bent in mutually opposite directions, vibration energy of the tuning bar vibrators 100 and 200 is trapped inside and thereby the vibrations hardly leak outside. In other words, in the composite vibrator 10, since the tuning bar vibrators 100 and 200 vibrate in the mutually opposite directions, the center of gravity in the composite vibrator 10 is always maintained between the tuning bar vibrators 100 and 200 without shifting. As a result, the vibrations of the tuning bar vibrators 100 and 200 hardly leak outside. Thus, since loss caused by vibration leakage of the tuning bar vibrators 100 and 200 decreases, the angular-velocity detection sensitivity can be improved. Particularly, the vibrations in the width direction are excitation vibrations with large amplitude. Thus, when the vibration leakage is reduced, the angular-velocity detection sensitivity is significantly improved.

Figure 10A:
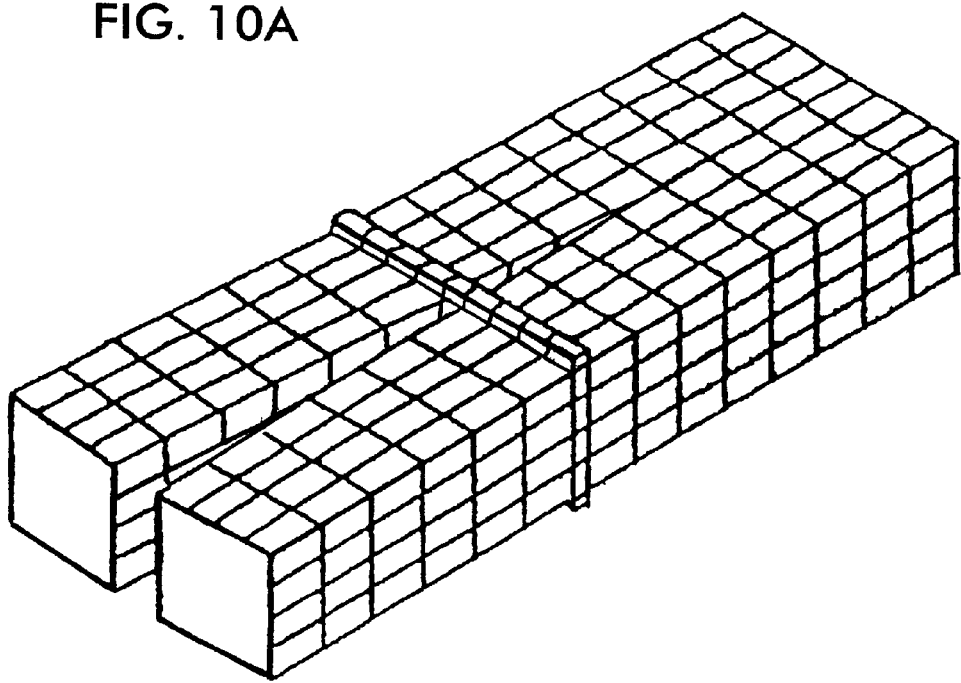
FIGS. 10A and 10B illustrate analytical results of the vibrations of the composite vibrator obtained with the use of a finite element method.
Figure 10B:
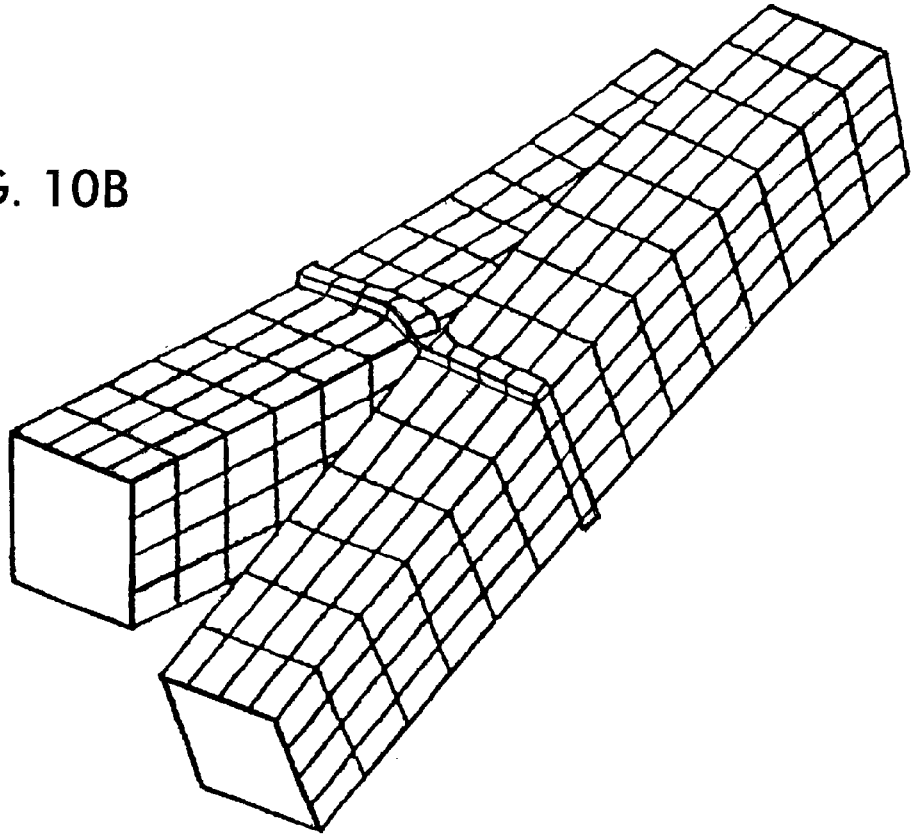

Next, FIGS. 10A and 10B illustrate analytical results regarding the vibrations of a composite vibrator obtained based on a finite element method. Here, a more detailed explanation will be given of the resonant frequency of the composite vibrator. FIG. 10A shows results about an A-mode excitation state of the composite vibrator analyzed by the finite element method. FIG. 10B shows results about a B-mode bending state of the composite vibrator analyzed by the same method. Each of FIGS. 10A and 10B illustrates the half side of the composite vibrator in the longitudinal direction. The only point different from the structure of the composite vibrator 10 is that a ratio between the length L1 of the thickness direction and the length L2 of the width direction is set to be approximately 1.

In FIG. 10, when the composite vibrator is excited at the A mode, the resonant frequency of bending vibrations in the width direction is 22.73 kHz, and when the vibrator is bent at the B mode, the resonant frequency of bending vibrations in the thickness direction is 28.05 kHz. Thus, the resonant frequency in the thickness direction is higher than the resonant frequency in the width direction. As shown here, when the resonant frequency in the thickness direction does not coincide with the resonant frequency in the width direction, the efficiency of vibrations is deteriorated and thereby the sensitivity for the detection of an angular velocity is reduced.

Therefore, in the composite vibrator 10 of the present invention, only the resonant frequency of bending vibrations in the thickness direction becomes lower by reducing the length of the thickness direction. In other words, in the composite vibrator 10, the ratio between the length L1 of the thickness direction and the length L2 of the width direction, that is, the value of L1/L2, is set to be 22.73 kHz/28.05 kHz (which equals to approximately 0.8), and the resonant frequency in the thickness direction is set to be 22.73 kHz, which is the same as the resonant frequency in the width direction. As shown here, in the composite vibrator 10, since the resonant frequency in the thickness direction coincides with the resonant frequency in the width direction, vibration efficiency is increased and thereby the angular-velocity detection sensitivity is improved.

Figure 11:
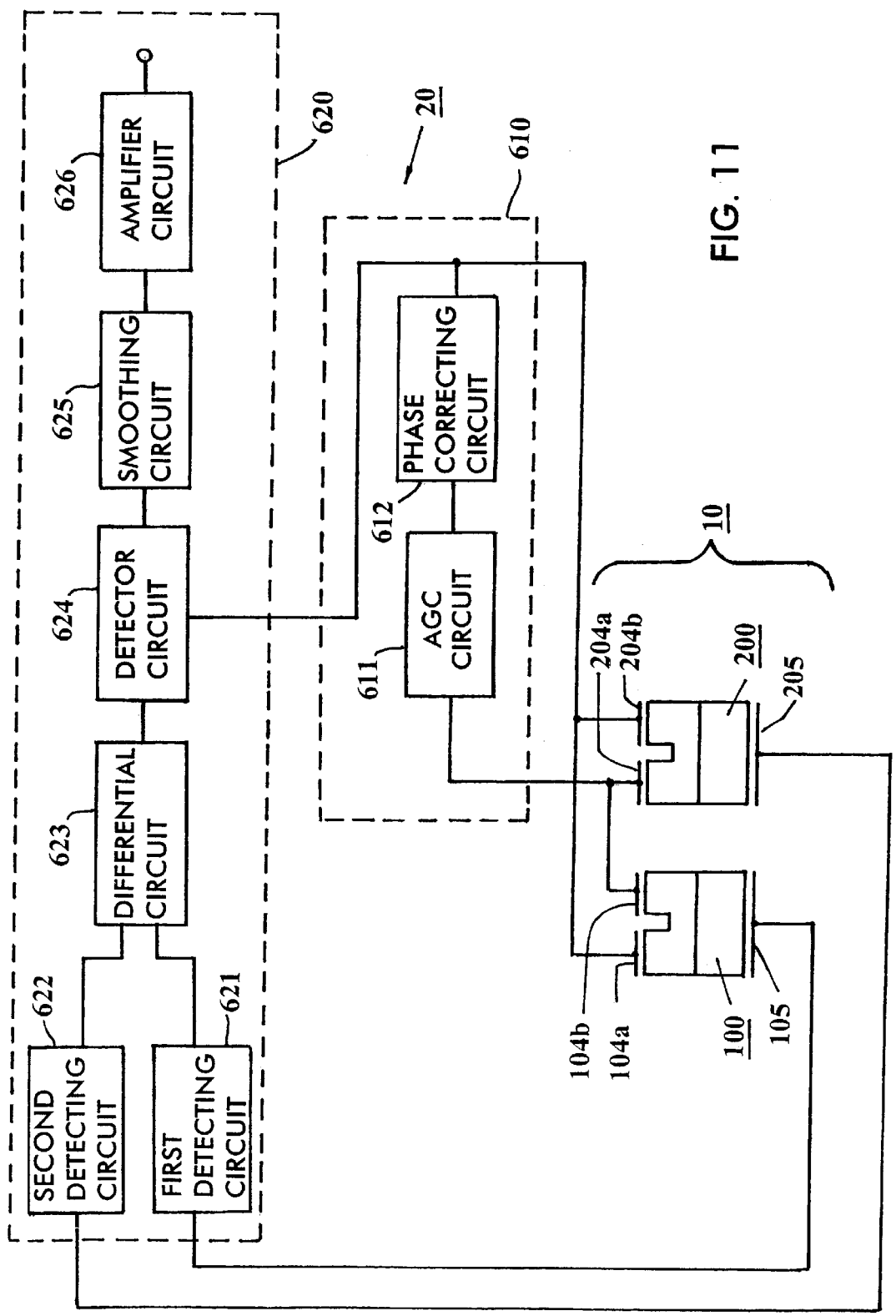
FIG. 11 is a circuit block diagram of a vibration gyroscope according to an embodiment of the present invention.

Next, FIG. 11 shows a circuit block diagram of a vibration gyroscope 20 using the composite vibrator 10 according to an embodiment of the invention. In each of FIGS. 11, 13, and 15 to 17, support members will not be shown.

In FIG. 11, the vibration gyroscope 20 includes the composite vibrator 10 shown in FIG. 1, an oscillating circuit 610 as a driving unit, and a detecting circuit 620 as a detecting unit. The oscillating circuit 610 includes an AGC circuit 611 and a phase correcting circuit 612 connected to the AGC circuit 611. The detecting circuit 620 includes a first detecting circuit 621, a second detecting circuit 622, a differential circuit 623 connected to the first detecting circuit 621 and the second detecting circuit 622, a detector circuit 624 connected to the differential circuit 623 and the phase correcting circuit 612, a smoothing circuit 625 connected to the detector circuit 624, and an amplifier circuit 626 connected to the smoothing circuit 625.

In the composite vibrator 10 of the vibration gyroscope 20, the first electrode 204a and the second electrode 104b are connected to the AGC circuit 611 via the support member 106b (not shown). The third electrode 105 is connected to the first detecting circuit 621 via the support member 106c (not shown). The third electrode 205 is connected to the second detecting circuit 622 via the support member 106d (not shown). In addition, the output of the phase correcting circuit 612 is connected to the first electrode 104a and the second electrode 204b via the support member 106a (not shown).

In the vibration gyroscope 20 having the above structure, the AGC circuit 611 makes the amplitude of a signal input from each of the second electrode 104b and the first electrode 204a constant to output the signal to the phase correcting circuit 612. The phase correcting circuit 612 corrects the phase of the input signal to apply a driving signal to each of the first electrode 104a and the second electrode 204b. The first detecting circuit 621 and the second detecting circuit 622 output the voltages of the third electrodes 105 and 205 to the differential circuit 623, which performs the subtraction of the input signal to output to the detector circuit 624. The detector circuit 624 detects the signal input from the differential circuit 623 with the use of an signal input from the phase correcting circuit 612 to output to the smoothing circuit 625. The smoothing circuit 625 smoothes the input signal to output to the amplifier circuit 626, which performs the DC amplification of the input signal to output the signal as an angular-velocity, signal outside.

In the vibration gyro 20 having the above structure, due to the increased mass of the composite vibrator 10, the angular-velocity detection sensitivity is improved.

In addition, since the vibration gyro 20 uses the compact composite vibrator 10, the vibration gyroscope can be miniaturized.

In addition, the vibration gyro 20 uses the composite vibrator 10 having high detection sensitivity, the angular-velocity detection sensitivity is improved.

Furthermore, in the vibration gyro 20, the oscillating circuit 610 is not directly connected to the detecting circuit 620 and these circuits are independent from each other. Thus, the gain of the oscillating circuit 610 and the gain of the detecting circuit 620 can be designed independently. As a result, without being influenced by the oscillating circuit 610, the gain of the detecting circuit 620 can be increased and thereby the angular-velocity detection can be performed with high precision.

Furthermore, in the vibration gyro 20, since the mass of the composite vibrator 10 becomes large, the sensitivity of signals output from the third electrodes 105 and 205 is improved. As a result, the detecting circuit 620 can be formed by using the amplifier circuit 626 having a small amplification rate. This can reduce circuit cost.

Figure 12:
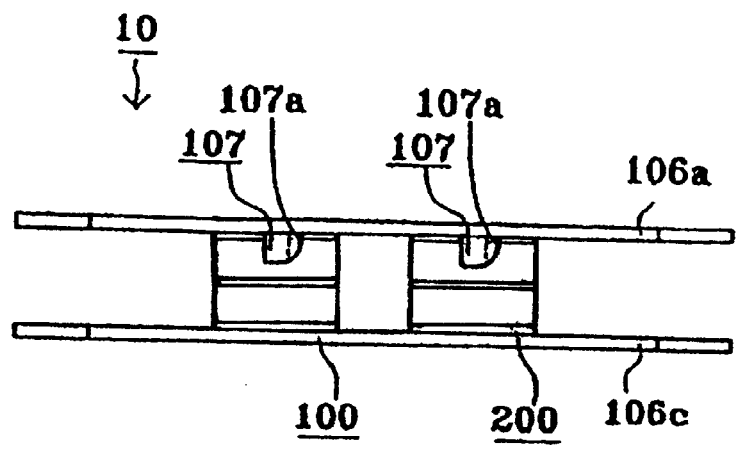
FIG. 12 illustrates curves generated by dicing.

When the deep grooves 107 are formed in the tuning bar vibrators 100 and 200, there are generated curves 107a as shown in FIG. 12. Such a curve tends to be generated when the tuning bar vibrators 100 and 200 are diced by a diamond wheel. In this case, due to stress applied only on one side of the part, size reduction becomes unbalanced. In the conventional vibration gyro 60, due to the curves generated, the dimensions of the first electrodes 104a and 204a or the second electrodes 104b and 204b are reduced. Thus, capacitance and piezoelectric performance capabilities become unbalanced between the electrodes having reduced dimensions and the electrodes maintaining the same dimensions. As a result, accurate angular-velocity detection cannot be performed.

In the vibration gyroscope 20 of the invention, the tuning bar vibrators 100 and 200 are polarized in the same direction, the second electrode 104b is connected to the first electrode 204a, and the first electrode 104a is connected to the second electrode 204b. Thus, in the vibration gyroscope 20, in the case of the formation of the deep grooves 107, even when the curves 107a are generated and thereby the dimensions of the first electrodes 104a and 204a or the dimensions of the second electrodes 104b and 204b are reduced, the balance is achieved in the capacitance and piezoelectric performance capabilities between the first and second electrodes 104a and 204b and the first and second electrodes 204a and 104b.

Figure 13:
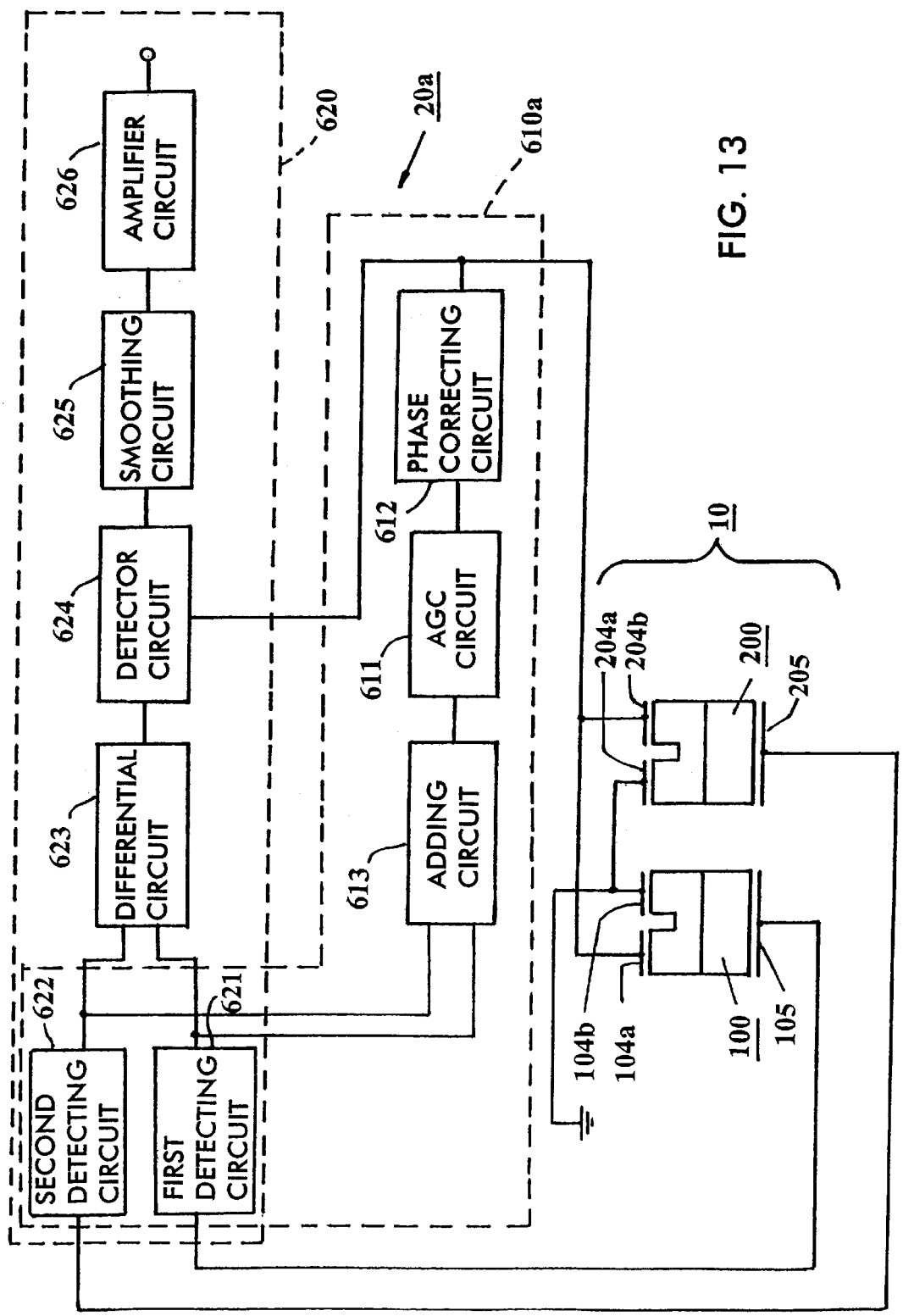
FIG. 13 is a circuit block diagram of a vibration gyroscope according to another embodiment of the present invention.

Next, FIG. 13 shows a circuit block diagram of a vibration gyroscope using the composite vibrator 10 according to another embodiment of the invention.

In FIG. 13, a vibration gyroscope 20a includes an oscillating circuit 610a as an alternative to the oscillating circuit 610 of the vibration gyroscope 20 shown in FIG. 11.

The oscillating circuit 610a includes, in addition to the structure of the oscillating circuit 610, a first detecting circuit 621, a second detecting circuit 622, and an adding circuit 613. The oscillating circuit 610a is different from the oscillating circuit 610 in the only one point that the adding circuit 613 is connected to the first detecting circuit 621 and the second detecting circuit 622.

In the composite vibrator 10 of the vibration gyroscope 20a, the first electrode 204a and the second electrode 104b are grounded. The first electrode 104a and the second electrode 204b are connected to the phase correcting circuit 612. The third electrode 105 is connected to the first detecting circuit 621 and the third electrode 205 is connected to the second detecting circuit 622. The adding circuit 613 of the vibration gyroscope 20 performs the addition of signals output from the first detecting circuit 621 and the second detecting circuit 622 to output to the AGC circuit 611.

In the vibration gyroscope 20a having the above structure, the composite vibrator 10 is excited at the A mode, and when an angular velocity is applied, the vibrator 10 is bent at the B mode to output a signal corresponding to the angular velocity. In actual vibrations, since the first electrode 204a and the second electrode 104b are grounded, the composite vibrator 10 is excited in directions indicated by arrows, being deviated from the A mode. When an angular velocity is applied, the vibrator 10 is bent in a direction orthogonal to the exciting direction.

The vibration gyroscope 20a having the above structure can also obtain the same advantages as those obtained in the vibration gyroscope 20.

Figure 14:
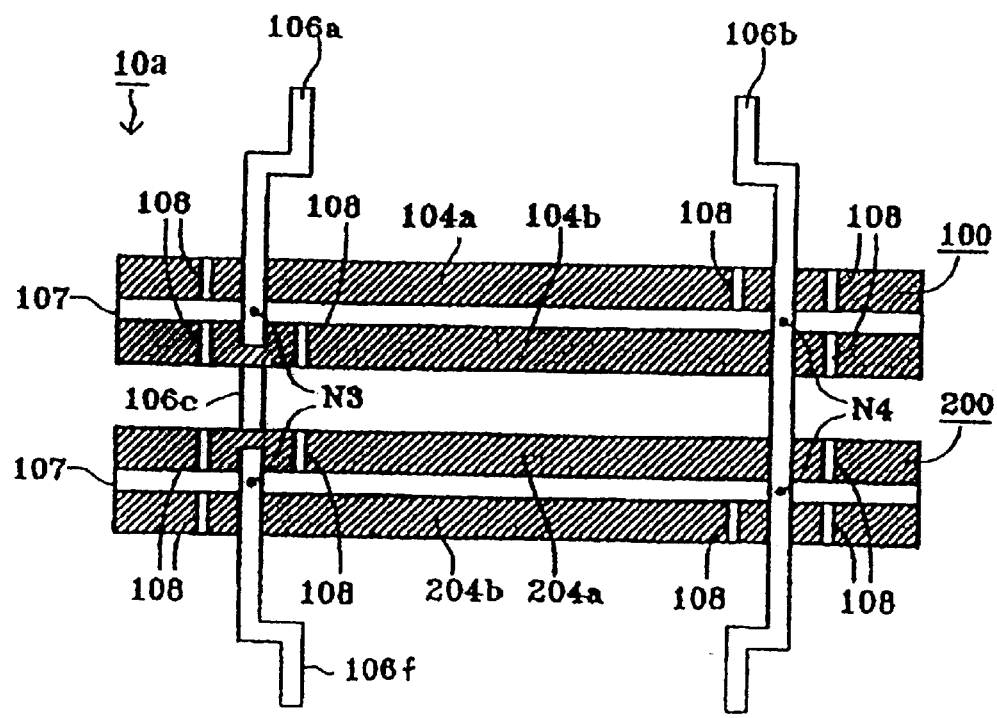
FIG. 14 is a plan view of a composite vibrator according to another embodiment of the present invention.
Figure 15:
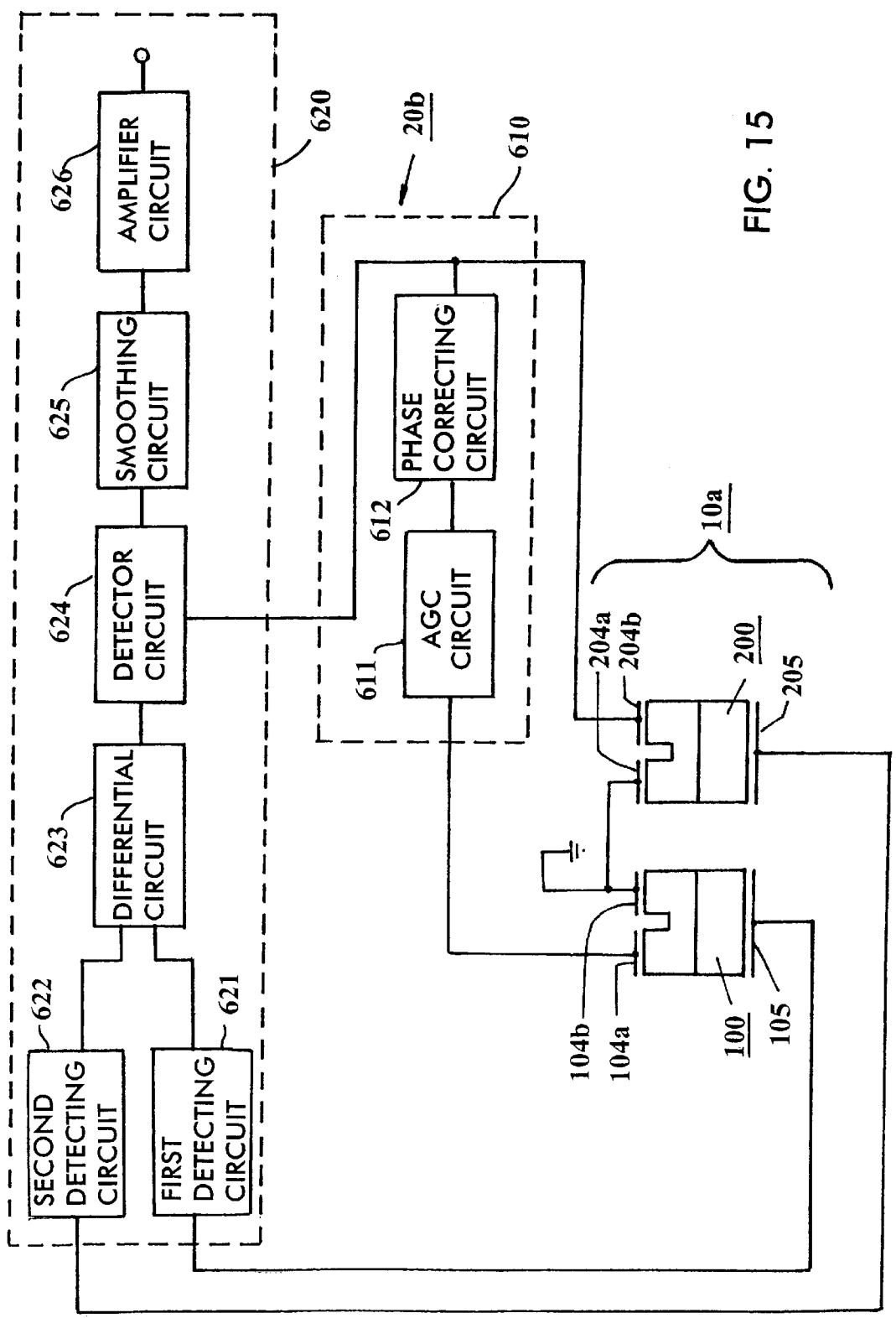
FIG. 15 is a circuit block diagram of a vibration gyroscope according to another embodiment of the present invention.

Next, FIG. 14 shows a plan view of a composite vibrator according to another embodiment of the invention. FIG. 15 shows a circuit block diagram of a vibration gyroscope using the composite vibrator shown in FIG. 14, according to another embodiment of the invention.

In FIG. 14, a composite vibrator 10a has support members 106e and 106f as alternatives to the support member 106a. This is the only one point different from the structure of the composite vibrator 10. The support member 106e is connected to the first electrode 104a and the support member 106f is connected to the second electrode 204b. Like the support member 106a, the support members 106e and 106f support the tuning bar vibrators 100 and 200 and serve as leads.

In FIG. 15, instead of the composite vibrator 10 of the vibration gyroscope 20 shown in FIG. 11, a vibration gyroscope 20b includes the composite vibrator 10a. Additionally, in the composite vibrator 10a of the vibration gyroscope 20b, the first electrode 104a is connected to the AGC circuit 611 via the support member 106e (not shown). The second electrode 204b is connected to the phase correcting circuit 612 via the support member 106f (not shown). The first electrode 204a and the second electrode 104b are grounded. The third electrode 105 is connected to the first detecting circuit 621 and the third electrode 205 is connected to the second detecting circuit 622.

In the vibration gyroscope 20b having the above structure, the composite vibrator 10 is excited at the A mode, and when an angular velocity is applied, the vibrator 10 is bent at the B mode and a signal corresponding to the angular velocity is output.

The vibration gyroscope 20b can also obtain the same advantages as those obtained in the vibration gyroscope 20.

Figure 16:
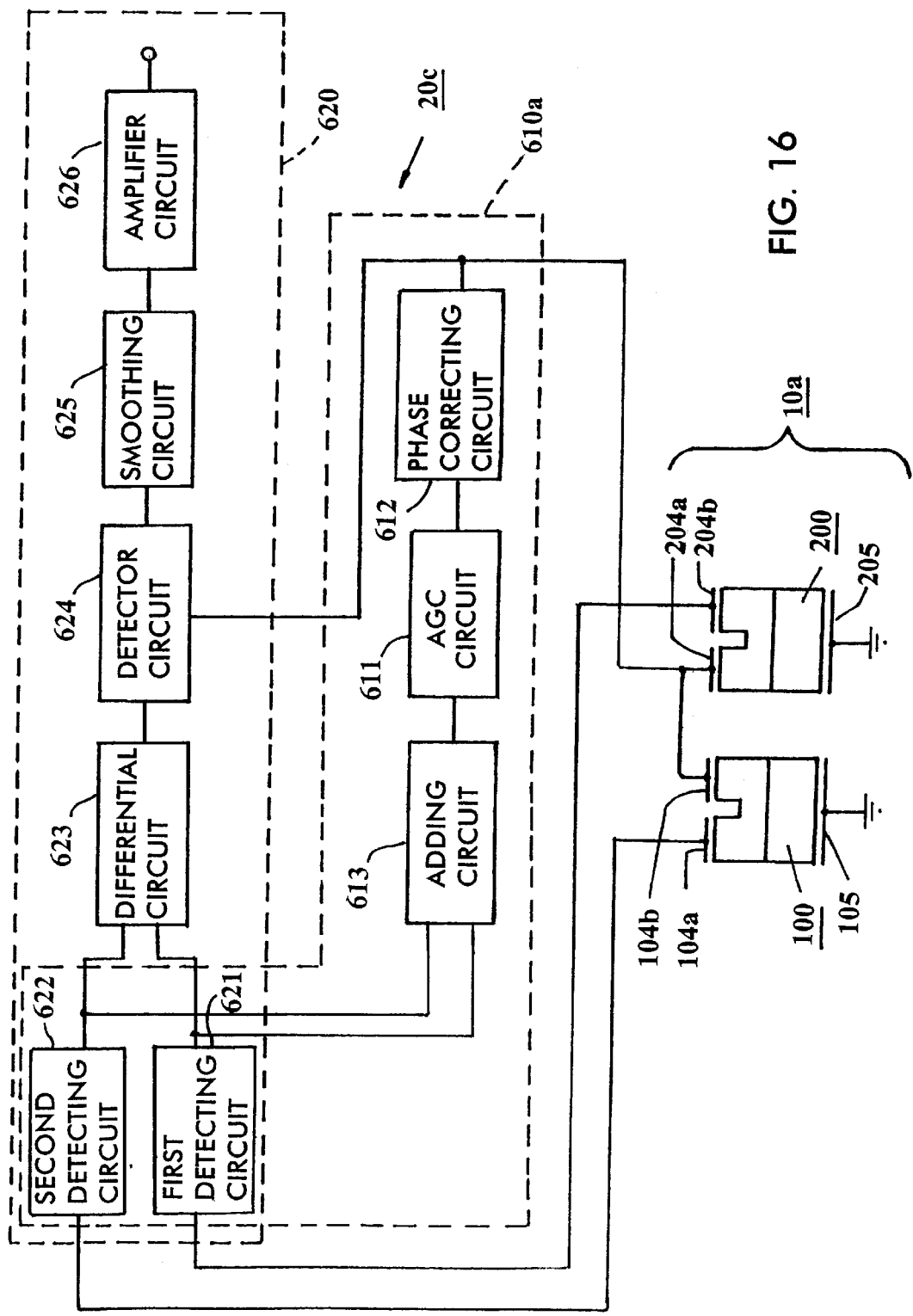
FIG. 16 is a circuit block diagram of a vibration gyroscope according to another embodiment of the present invention.

Next, FIG. 16 shows a circuit block diagram of a vibration gyroscope using the composite vibrator of the invention, according to another embodiment of the invention.

In FIG. 16, a vibration gyroscope 20c of the invention includes the composite vibrator 10a as an alternative to the composite vibrator 10 of the vibration gyroscope 20a shown in FIG. 13.

In the composite vibrator 10a of the vibration gyroscope 20c, the first electrode 104a is connected to the second detecting circuit 622 and the second electrode 204b is connected to the first detecting circuit 621. The first electrode 204a and the second electrode 104b are connected to the phase correcting circuit 612. The third electrodes 105 and 205 are grounded.

In the vibration gyroscope 20c having the above structure, the composite vibrator 10a is excited at the A mode, and when an angular velocity is applied, the vibrator 10a is bent at the B mode. Then, a signal corresponding to the angular velocity is output.

The vibration gyroscope 20c can also obtain the same advantages as those obtained in the vibration gyroscope 20.

In the vibration gyroscope 20c, the third electrodes 105 and 205 have the same potential. Thus, on the main surface on which the third electrodes 105 and 205 are formed, instead of forming the shallow grooves 108 shown in FIG. 3, the support members 106c and 106d may be connected to the third electrodes 105 and 205.

Figure 17:
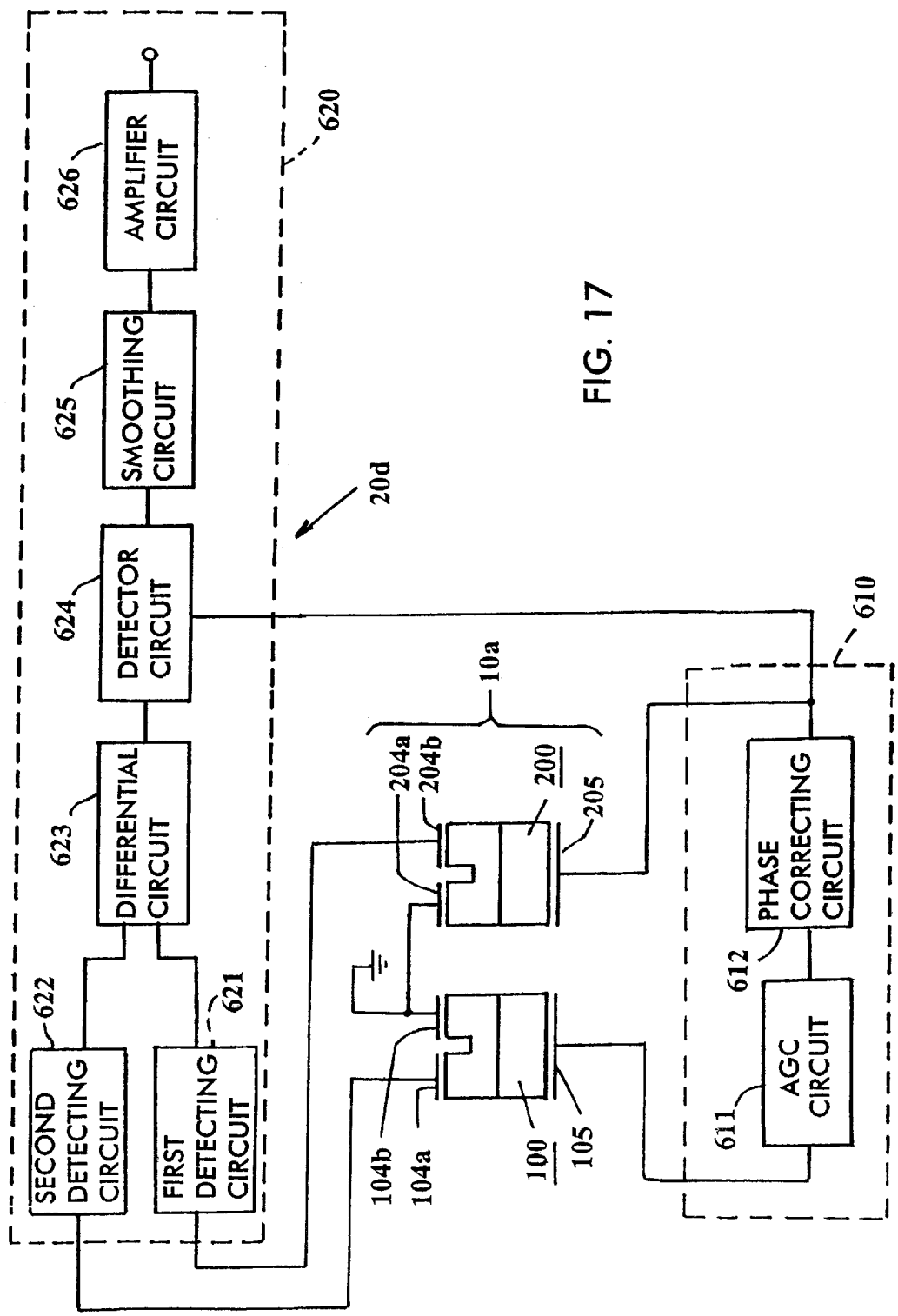
FIG. 17 is a circuit block diagram of a vibration gyroscope according to another embodiment of the present invention.

Next, FIG. 17 shows a circuit block diagram of a vibration gyroscope using the composite vibrator of the invention, according to another embodiment of the invention.

In FIG. 17, a vibration gyroscope 20d of the invention includes the composite vibrator 10a as an alternative to the composite vibrator 10 of the vibration gyroscope 20 shown in FIG. 11.

In the composite vibrator 10a of the vibration gyroscope 20d, the first electrode 104a is connected to the second detecting circuit 622 and the second electrode 204b is connected to the first detecting circuit 621. The first electrode 204a and the second electrode 104b are grounded. The third electrode 105 is connected to the AGC circuit 611 and the third electrode 205 is connected to the phase correcting circuit 612.

In the vibration gyroscope 20d having the above structure, the composite vibrator 10a is excited at the B mode, and when an angular velocity is applied, the vibrator 10a is bent at the A mode and then a signal corresponding to the angular velocity is output.

The vibration gyroscope 20d can also obtain the same advantages as those obtained in the vibration gyroscope 20.

In each of the above embodiments, the first detecting circuit and the second detecting circuit may be a current detecting circuit, a voltage detecting circuit, a capacitance detecting circuit, a buffer circuit, a non-inverting amplifier, an inverting amplifier, or the like.

Figure 18:
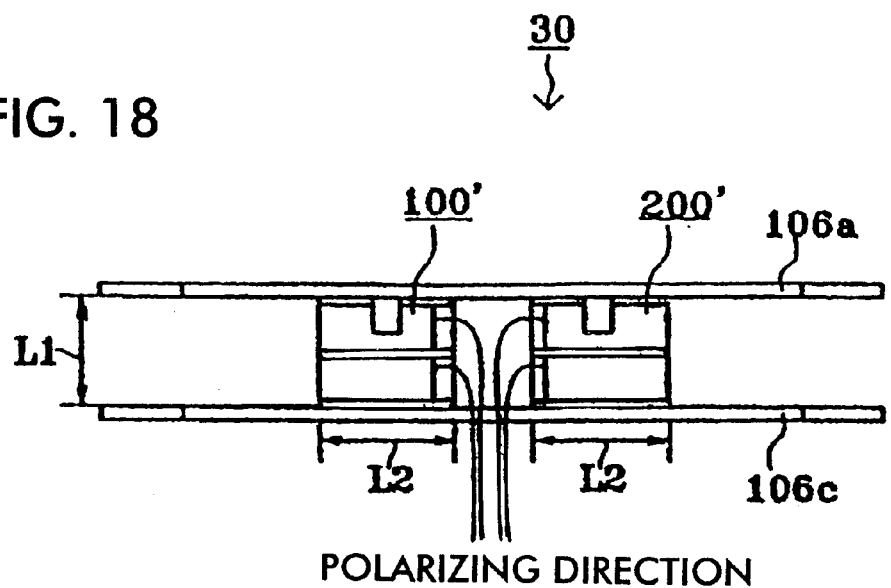
FIG. 18 is a left side view of a composite vibrator according to another embodiment of the invention.
Figure 19:
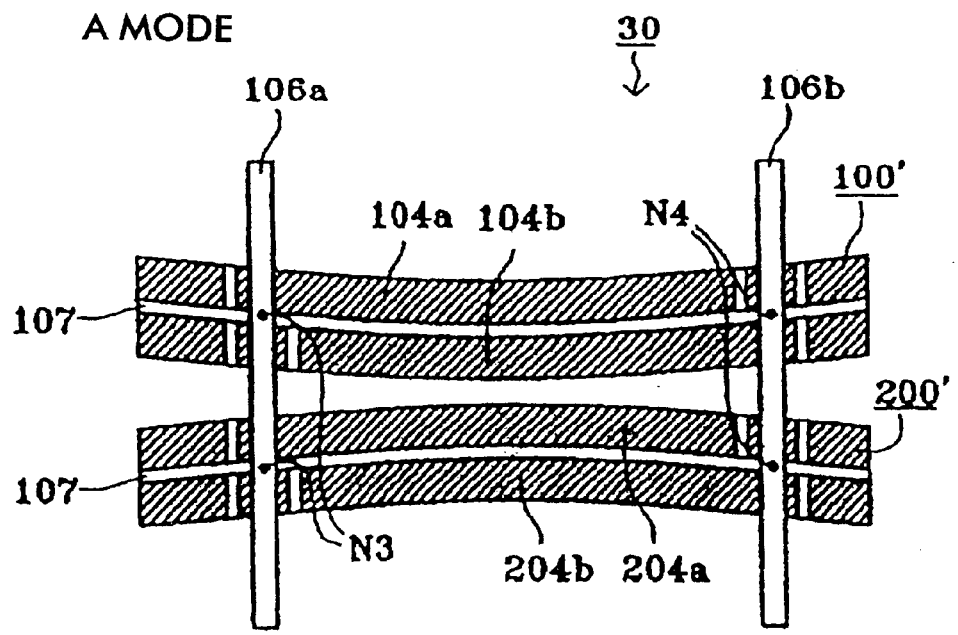
FIG. 19 is a plan view showing the performance of the composite vibrator shown in FIG. 18.
Figure 20:
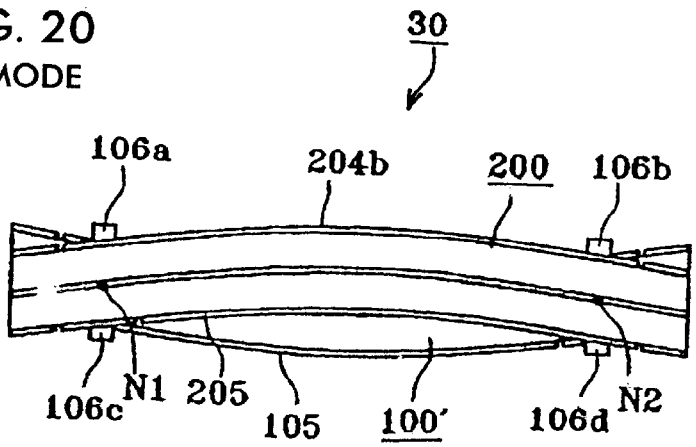
FIG. 20 is a front view showing the performance of the composite vibrator shown in FIG. 18.

Next, FIG. 18 shows a left side view of a composite vibrator according to another embodiment of the invention. FIGS. 19 and 20 show a plan view and a front view illustrating the performance of a composite vibrator 30.

In each of FIGS. 18 to 20, unlike the composite vibrator 10, the composite vibrator 30 includes tuning bar vibrators 100' and 200' as alternatives to the tuning bar vibrators 100 and 200 of the composite vibrator 10 shown in FIG. 4. In addition, in the composite vibrator 30, the first electrodes 104a and 204a, and the second electrodes 104b and 204b are connected in a manner different from that in the composite vibrator 10.

The tuning bar vibrators 100' and 200' of the composite vibrator 30 are polarized in mutually opposite directions as indicated by arrows shown in FIG. 18. Then, the first electrodes 104a and 204a are connected to the support member 106a and the second electrodes 104b and 204b are connected to the support member 106b.

In the composite vibrator 30 having the above structure, with the oscillating circuit 610 shown in FIG. 11, an exciting signal is applied between the first electrodes 104a and 204a connected to the support member 106a and the second electrodes 104b and 204b connected to the support member 106b to excite the composite vibrator 30 at the A mode as shown in FIG. 19.

When an angular velocity, whose rotational axis is the longitudinal direction of the composite vibrator 30, is applied to the composite vibrator 30, the composite vibrator 30 performs bending vibrations at the B mode as shown in FIG. 20. A signal corresponding to the bending vibrations is output from each of the third electrodes 105 and 205 via the support members 106c and 106d. The signal output from each of the third electrodes 105 and 205 is processed by a detecting circuit (not shown), in which the differential circuit 623 of the detecting circuit 620 shown in FIG. 11 is replaced by a cumulative circuit.

In the composite vibrator 30, when curves as shown in FIG. 12 are generated due to the formation of the deep grooves 107, capacitance and piezoelectric performance capabilities become unbalanced and thereby the accuracy of angular-velocity detection is deteriorated. However, in other respects, the composite vibrator 30 can provide the same advantages as those obtained in the composite vibrator 10.

In each of the above embodiments, instead of the tuning bar vibrators 100, 200, 100', and 200', there may be used tuning bar vibrators having three or more electrodes formed on first main surfaces thereof. Even in this case, the composite vibrator can provide the same advantages as those obtained in the composite vibrator 10. Furthermore, the composite vibrator of the invention may be formed by using tuning bar vibrators in which piezoelectric members are bonded to metal pieces. In this case, also, the composite vibrator can provide the same advantages as those obtained in the composite vibrator 10.

In each of the embodiments, the composite vibrator of the invention includes the support members 106a, 106b, 106c, and 106d. However, even with only the use of one of the support member 106a or 106c and one of the support member 106b or 106d, there can be provided the same advantages as those obtained in the composite vibrator 10.

Furthermore, in some of the above embodiments, the composite vibrator of the invention is excited at an excitation mode of the composite vibrator using the two tuning bar vibrators, that is, at the A mode. Then, when an angular velocity is applied, the composite vibrator vibrates at the B mode. In other cases, the composite vibrator of the invention is excited at the B mode, and when an angular velocity is applied, it is excited at the A mode. Vibration modes applicable to the present invention are not restricted to the modes of the above embodiments. For example, the vibration mode of a composite vibrator using three or more tuning bar vibrators may be used.

Figure 21:
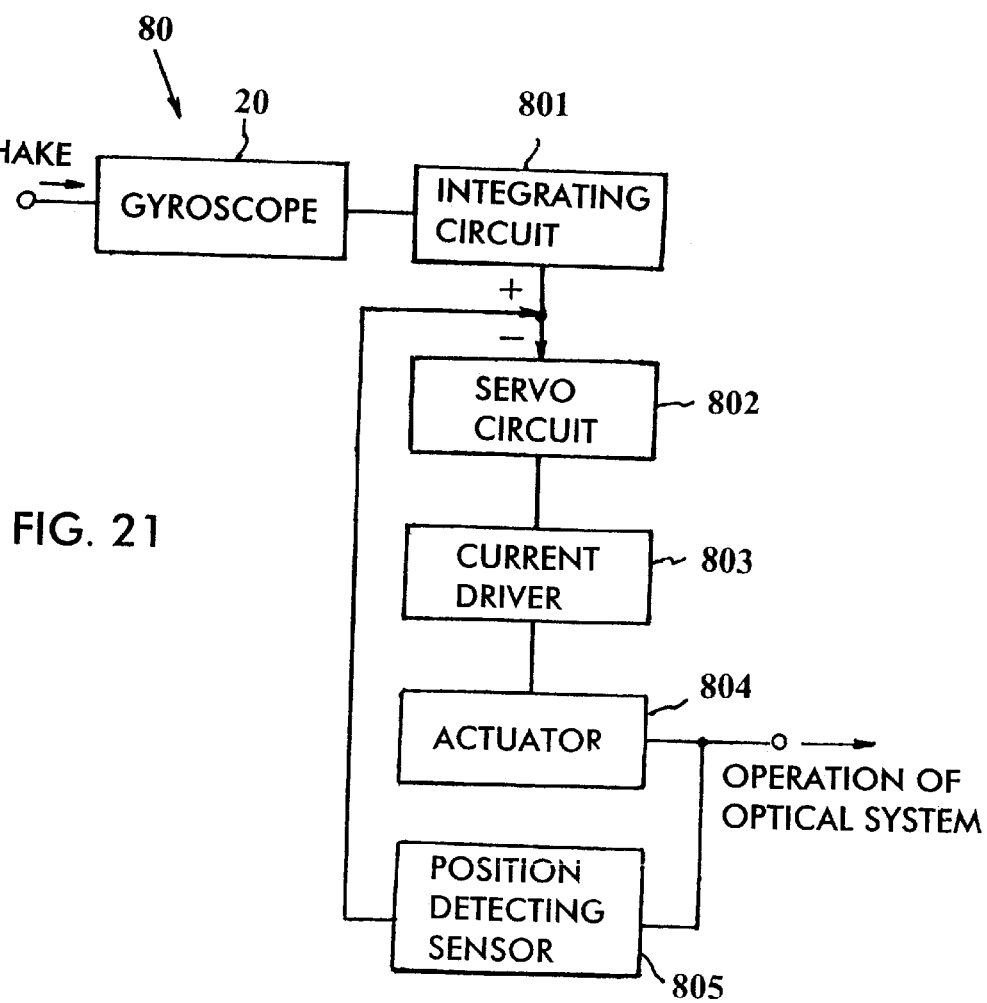
FIG. 21 is a block diagram of a shake preventing circuit used in an electronic apparatus according to an embodiment of the invention.

Next, FIG. 21 shows an electronic apparatus using the vibration gyroscope of the invention, according to an embodiment of the invention. FIG. 21 is a block diagram of a shake preventing circuit used in a video camera, as one example of the electronic apparatus of the invention. A shake preventing circuit 80 includes the vibration gyroscope 20, an integrating circuit 801, a servo circuit 802, a current driver 803, an actuator 804, and a position detecting sensor 805. In the shake preventing circuit 80, the vibration gyroscope 20, the integrating circuit 801, the servo circuit 802, the current driver 803, and the actuator 804 are connected in series. An output feedback from the actuator 804 is given to the servo circuit 802 via the position detecting sensor 805.

In the shake preventing circuit 80 having the above structure, regarding shake given to a video camera, only the angular velocity is input from the vibration gyroscope 20 to the integrating circuit 801. The integrating circuit 801 integrates the angular-velocity signal to convert into a shake angle of the video camera and output the signal to the servo circuit 802. The servo circuit 802 uses the shake angle signal input from the integrating circuit 801 and a signal from the position detecting sensor 805 to calculate the difference between the present value and a target value and outputs the result to the current driver 803. The current driver 803 outputs a current corresponding to the input signal to the actuator 804. The actuator 804 mechanically drives the optical system of the video camera. Then, the position detecting sensor 805 outputs the signal of a shake angle driving the optical system to the servo circuit 802.

The video camera having the above structure, as the electronic apparatus according to the invention, incorporates the vibration gyroscope capable of accurately detecting an angular velocity with high sensitivity. Thus, the influence of shake can be appropriately prevented.

Although the embodiment of the electronic apparatus of the invention has been described by using the video camera, the electronic apparatus of the invention is not restricted to the video camera having the above structure.

As described above, in the composite vibrator of the invention, the tuning bar vibrators are coupled with each other. Thus, even when lengths of the longitudinal directions of the tuning bar vibrators are reduced, due to the increased mass, the sensitivity for the detection of an angular velocity is improved.

In addition, in the composite vibrator of the invention, the tuning bar vibrators are excited in mutually opposite directions to be bent in mutually opposite directions. Thus, vibrations of the tuning bar vibrators are trapped inside and thereby the vibrations hardly leak outside. As a result, since loss caused by leakage of the vibrations of the tuning bar vibrators is reduced, the angular-velocity detection sensitivity is improved.

Furthermore, since the vibration gyroscope of the invention uses the composite vibrator with high detection sensitivity, the angular-velocity detection sensitivity is improved.

In addition, since the vibration gyroscope of the invention uses the compact composite vibrator, the vibrator gyroscope can be miniaturized.

In addition, in the method of manufacturing the composite vibrator of the invention, in the first step, the base substrate is bonded to the auxiliary substrate, and while maintaining the bonding state, the second to fourth steps are sequentially performed. Thus, the positional deviations of the tuning bar vibrators are prevented. As a result, the composite vibrator including the tuning bar vibrators having the same configuration can be easily manufactured.

The electronic apparatus of the invention uses the vibration gyroscope capable of accurately detecting an angular velocity with high sensitivity. Thus, a precise control mechanism can be formed.

While preferred embodiments of the invention have been described above, variations and modifications thereto will occur to those skilled in the art within the scope of the present invention. The scope of the invention, therefore, is to be determined solely by the following claims.

What is claimed is:

1. A composite vibrator comprising:

a plurality of tuning bar vibrators having the same length; and support members for supporting the tuning bar vibrators;

wherein the tuning bar vibrators with both ends free are arranged in a direction orthogonal to the longitudinal directions thereof and are coupled with each other in the vicinity of nodes of bending vibrations.

2. The composite vibrator according to claim 1, wherein the plurality of tuning bar vibrators includes at least two tuning bar vibrators having the same configuration.

3. The composite vibrator according to claim 1, wherein each tuning bar vibrator has an electrode to which a signal for exciting the tuning bar vibrator is applied and an electrode from which a signal corresponding to bending vibration of the tuning bar vibrator in a direction orthogonal to the direction of excitation is output.

4. The composite vibrator according to claim 3, wherein adjacent tuning bar vibrators are excited in mutually opposite directions.

5. The composite vibrator according to claim 1, wherein a resonant frequency in the exciting direction of at least one of the tuning bar vibrators coincides with a resonant frequency in the direction orthogonal to the exciting direction.

6. The composite vibrator according to claim 3, wherein at least two electrodes formed in the longitudinal direction of a main surface of each tuning bar vibrator are arranged at a predetermined distance in the width direction thereof.

7. A vibration gyroscope comprising driving unit for driving the composite vibrator according to claim 1 and detecting unit for detecting an angular velocity via the composite vibrator.

8. An electronic apparatus comprising the vibration gyroscope according to claim 7.

* * * * *